United States Patent [19]

Levine et al.

[11] Patent Number: 4,841,458
[45] Date of Patent: Jun. 20, 1989

[54] ANALOG TO DIGITAL CONVERSION BY MEASURING THE RATIO OF RC TIME CONSTANTS

[75] Inventors: Michael R. Levine; Victor Rigotti; James Russo, all of Ann Arbor; Nicholas Skogler, Ypsilanti, all of Mich.

[73] Assignee: Honeywell, Incorporated, Minneapolis, Minn.

[21] Appl. No.: 70,727

[22] Filed: Jul. 7, 1987

[51] Int. Cl.⁴ .................... G01K 7/24; G01R 27/02
[52] U.S. Cl. ................................ 364/557; 324/62; 340/584; 374/184; 374/185
[58] Field of Search .............. 307/117; 340/584; 364/557; 374/170, 184, 185; 324/62

[56] References Cited

U.S. PATENT DOCUMENTS

| | | | |
|---|---|---|---|
| 3,672,218 | 6/1972 | Hartman | 374/170 |
| 3,911,374 | 10/1975 | Busse et al. | 374/185 X |
| 4,150,573 | 4/1979 | Iinuma et al. | 374/185 |
| 4,206,872 | 6/1980 | Levine | 340/309.15 X |
| 4,362,988 | 12/1982 | Weimer | 324/62 |
| 4,492,916 | 1/1985 | Johnson | 324/62 X |

Primary Examiner—Parshotam S. Lall
Assistant Examiner—Edward R. Cosimano
Attorney, Agent, or Firm—Krass & Young

[57] ABSTRACT

The present invention is a technique for forming a digital signal representing an environmental condition. The technique consists of measuring the variable time constant of an analog sensing device having a variable resistance dependent upon the environmental condition and a capacitor as well as measuring the reference time constant of a precision fixed resistor and the same capacitor. The time constants are measured by discharging the capacitor, charging the capacitor through the appropriate element and measuring the time for the voltage across the capacitor to reach a predetermined level. Lastly, the digital ratio between the two time constants is formed. This digital ratio is the digital representation of the environmental condition sensed by said analog sensing device.

5 Claims, 5 Drawing Sheets

ANALOG TO DIGITAL CONVERSION BY MEASURING THE RATIO OF RC TIME CONSTANTS

FIELD OF THE INVENTION

The technical field of this invention is programmable digital electronic thermostats and more particularly the manner of reading temperature from a thermistor employed in such a thermostat.

BACKGROUND OF THE INVENTION

Programmable digital electronic thermostats are known in the art, such as U.S. Pat. No. 4,206,872 entitled "Electronic Thermostat" issued June 10, 1980 to Michael R. Levine. A typical thermostat of this type employs a programmable microprocessor which controls the measurement of temperature and the control of a temperature modifying apparatus, such as a heating unit or air conditioning unit, based upon the relationship between the measured ambient temperature and a desired temperature. Typically the desired temperature is selected from a user programmable table of desired temperatures for different times of the day and days of the week. The most simple type of program for the desired temperature is night setback, in which the set point for a heating unit is reduced at night when the occupants are asleep and less heat in needed. Electronic thermostats of this type typically employ a thermistor to measure the temperature.

A thermistor is an electronic component having an electrical resistance which varies with its temperature. Typically such electronic thermostats do not measure the resistance of the thermistor directly. Most typically the resistance of the thermistor is measured by measuring the time constant of an RC circuit in which the resistance of the thermistor is the major contributor to the resistance. This time constant can be measured directly by timing the period needed for the voltage across the capacitor of the RC circuit to charge to a predetermined voltage through the resistance including the thermistor. Alternatively the time constant can be measured indirectly by measuring the frequency of a variable frequency oscillator whose frequency is set by the RC circuit, as disclosed in the above named U.S. Pat. No. 4,206,872.

The measurement of the resistance of the thermistor in this manner is advantageous from a cost stand point. The measurement of the time constant of an RC circuit, either directly or via measurement of the frequency of a variable frequency oscillator, can be performed using simple timing circuits which are adaptable for use with the typical microprocessor employed in such electronic thermostats. By contrast the direct measurement of the resistance of the thermistor would require the use of some sort of analog to digital conversion device which would be most expensive.

There are problems with use of such a technique for measurement of temperature. Firstly, the RC time constant is equally sensitive to any variations in the capacitance. This leads to inaccuracies because the typical inexpensive capacitors employed in these thermostats are neither stable or accurately calibrated. Secondly, the time measured by the RC time constant is also sensitive to the supply voltage. In a typical electonic thermostat of this type the power supply regulation is poor. Thus there is a need for an inexpensive technique to obtain an accurate measure of the resistance of a thermistor that is relatively insensitive to variations in capacitance and supply voltage.

SUMMARY OF THE INVENTION

The present invention enables determination of the resistance of a thermistor via the measurement of its RC time constant, and hence the ambient temperature, in a manner which is relatively insensitive to changes in capacitance and supply voltage. The measurement is achieved by comparing the time constant of an RC circuit with the thermistor as the major source of resistance with the time constant of an RC circuit employing a precision fixed resistor. These measurements take place under similar conditions and employing the same capacitor and the same supply voltage. With the time constant of the precision fixed resistor as a reference, the resistance measurement and hence the temperature measurement is made more accurate.

In accordance with the preferred embodiment of the present invention time constant measurements are made sequentially for the thermistor and the precision fixed resistor. A capacitor is discharged and then charged via the thermistor. The time for the voltage across the capacitor to reach a predetermined voltage is measured. The capacitor is again discharged and charged via the precision fixed resistor. The time for the voltage across the capacitor to reach the predetermined voltage is again measured. A ratio is formed of these two measured times. This yields the ratio of the resistances of the thermistor and the precision fixed resistor. Since the resistance of the precision fixed resistor is known, the resistance of the thermistor is determined.

Such a two part measurement serves to reduce or eliminate the major sources of inaccuracy. Because the same capacitor is employed in both measurements, any inaccuracy in the knowledge of the exact capacitance of this capacitor is removed when the ratio of time constants is formed. It is believed that any changes in the value of the capacitance of the capacitor between consecutive time constant measurements is so small as to not affect the accuracy of the resistance measurement. Similarly, if the two time constant measurements are taken in rapid succession then any change inaccuracies due to the poor regulation of the power supply voltage is minimized.

The present invention includes a additional refinement which further minimizes any inaccuracy due to change in the supply voltage. The time constant is first measured with the precision fixed resistor, next measured with the thermistor and lastly again measured with the precision fixed resistor. The two measurements of the time constant of the precision fixed resistor are compared. If they differ my more than a small predetermined amount, then the measurements cannot be confirmed as accurate. In this event the set of measurements is repeated. Any drift in the voltage of the power supply during the sequence of measurements is thus eliminated.

The preferred embodiment of the present invention employs a set of tristate outputs from the microprocessor to control the measurement of time constants. Such a tristate output is either the positive or negative supply voltage or substantially isolated from both supply voltages. During measurement of a particular time constant one tristate output is employed to charge the capacitor through the selected element and other tristate outputs are set to the isolated state, thereby not contributing to the charge stored within the capacitor. An input having a predetermined voltage trigger is employed to sense the moment when the charge reaches the predetermined level. The microprocessor is programmed to provide the entire measurement sequence, measure the time required to charge the capacitor to the specified voltage and forms the ratio via its computational capabilities. In the preferred embodiment the measurement of the time occurs by a program incrementing a memory register in a closed loop, which is stopped when the voltage on the capacitor triggers a interrupt input. This technique minimizes the necessary components external to the microprocessor.

BRIEF DESCRIPTION OF THE DRAWINGS

These and other aspects of the present invention will become clear from study of the drawings in which.

DETAILED DESCRIPTION OF THE PREFERRED EMBODIMENT

Figure 1:
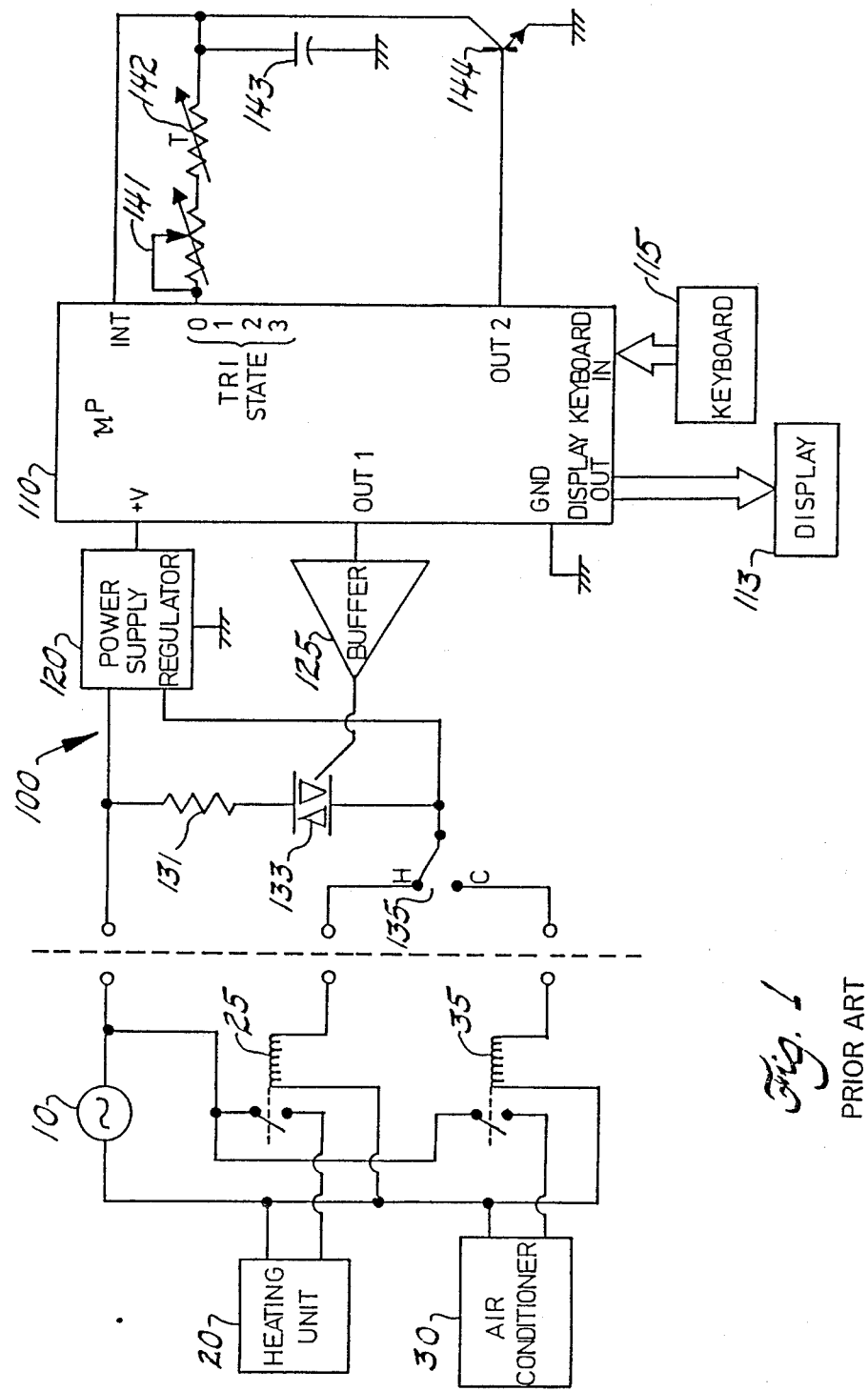
FIG. 1 illustrates an example of an electronic thermostat employing a microprocessor in accordance with the prior art.

FIG. 1 illustrates the typical construction of an electronic programmable thermostat in accordance with the prior art. Electronic programmable thermostat 100 includes microprocessor unit 110 which is coupled to display 113 and keyboard 115, power supply regulator 120, a buffer 125 which drives a triac 133, a series resistor 131, a heat/cool mode switch 135 and a temperature sensing circuit including variable resistor 141, thermistor 142, capacitor 143 and transistor 144. Electronic thermostat 100 is connected to a combined heating and air conditioning plant including AC power supply 10, heating unit 20 with an associated relay 25 and air conditioner 30 with associated relay 35.

Electronic thermostat 100 is programmed via keyboard 115 to store a sequence of desired temperatures at desired times. The ambient temperature of the thermostat is measured via thermistor 142. The resistance of thermistor 142 is measured by measuring the time constant of the RC circuit including variable resistor 141, thermistor 142 and capacitor 143. In accordance with the relationship with the measured temperature to the desired temperature, microprocessor unit 110 generates an output at output 1 to buffer 125 which controls whether triac 133 is triggered ON or not. If triac 133 is triggered ON then one of the relays 25 or 35 is supplied with electric power from AC source 10 depending upon the state of heat/cool mode switch 135. The actuated relay in turn operates the corresponding heating unit 20 or air conditioner 30.

Power supply regulator 120 is connected to receive power from the series connection of resistor 131 and triac 133. This power comes from AC power source 10. In the event that triac 133 is not triggered ON, then the full voltage of the AC power source 10 appears across the input to power supply regulator 120. If, on the other hand, triac 133 is triggered ON, then the voltage input to power supply regulator 120 is the voltage across triac 133 together with the IR voltage appearing across resistor 131. As a result, the input voltage applied to power supply regulator 120 varies widely depending on whether or not triac 133 is triggered ON. Therefore, power supply regulator 120 is employed to smooth these wide variations in supply voltage to derive the appropriate voltage for driving the microprocessor unit 110.

The ambient temperature is measured by the microprocessor unit 110 from the variable resistor 141, thermistor 142, capacitor 143 and transistor 144. Variable resistor 141 and thermistor 142 together with capacitor 143 form a RC time constant circuit. The resistance of thermistor 142 varies as a function of ambient temperature. This resistance is measured by measuring the time constant of this RC circuit. Microprocessor unit 110 includes a plurality of tristate output lines 0-3. One of these tristate output lines is applied to one end of the RC time constant circuit, while the other end of this RC time constant circuit is connected to ground.

These tristate output lines of microprocessor unit 110 have unique characteristics. The output of each of these tristate output lines can be driven to the power supply voltage in response to a "1" output or to the ground voltage in response to a "0" output. In this state the output line is connected through a relatively small resistance of 50 to 100 ohms to the respective voltage source. It is also possible to drive any of these tristate output lines to an indeterminate state in which the output line is connected to neither the positive supply voltage or ground. Typically, the isolation between the output and either the power supply voltage or ground is greater than 5 megaohms when in the indeterminate state.

Transistor 144 is connected across capacitor 143. Transistor 144 has its base connected to output 2 of the microprocessor unit 110. Transistor 144 is employed to discharge any charge which is stored on capacitor 143. In response to a "1" output on output 2 from microprocessor unit 110, transistor 144 is biased ON and discharges any charge stored in capacitor 143. In response to a "0" output at output 2 of microprocessor unit 110, transistor 144 is biased OFF and does not effect the charge on capacitor 143.

Lastly, the output voltage across capacitor 143 is connected to an interrupt input of microprocessor unit 110. This interrupt input includes a Schmidt trigger device which rapidly turns on when a predetermined voltage is reached at this input. This interrupt input is employed to signal microprocessor unit 110 that the voltage across capacitor 143 has exceeded this predetermined value.

During operation of electronic thermostat 100, the temperature indicated by thermistor 142 is measured employing a program stored within microprocessor unit 110 to control the output supplied to this measurement circuit. Firstly, transistor 144 is biased ON in order to discharge any charge stored in capacitor 143. During this operation the tristate output 0 could be held at either the indeterminate state or at ground through the output of a digital "0". After transistor 144 has been biased ON for a sufficient period to substantially discharge capacitor 143, output 2 supplied to the base of transistor 144 is changed to bias this transistor to OFF.

The time constant of the RC circuit is then measured. The tristate output line 0 is driven to the power supply voltage via the output of a digital "1". At the same time a timer circuit is initialized and begins to accumulate the elapsed time. This output from the tristate output line 0 causes the power supply voltage to be applied across variable resistor 141, thermistor 142 and capacitor 143. As a consequence, a current flows through this RC circuit and begins accumulate charge within capacitor 143. This accumulating charge within capacitor 143 causes the voltage thereacross to increase. This voltage is sensed by the interrupt input INT of microprocessor unit 110. When the voltage across capacitor 143 exceeds the predetermined threshold of interrupt input INT, this input is triggered. Microprocessor unit 110 is programmed to stop the elapsed time clock at this time. As a consequence, the time then indicated by the elapsed time clock is a measure of the time constant of the RC circuit. Ideally, the only variable in this time constant measurement is the resistance of thermistor 142. Therefore, this measured elapsed time is a measure of the temperature sensed by thermistor 142. Typically, microprocessor unit 110 includes a look-up table to convert this time to the corresponding temperature.

There are several disadvantages with the foregoing manner for sensing the temperature. Typically, the resistance of the thermistor is not the only variable in the system. In particular, the capacitance of capacitor 143 may change slowly with time. In addition, the exact temperature/resistance curve of thermistor 142 and the exact capacitance of capacitor 143 are not typically well defined. For this reason, variable resistor 141 has been included in the RC time constant circuit in order to adjust for these factors. Variable resistor 141 may be eliminated if a high precision thermistor 142 and a high precision capacitor 143 are employed. However, the magnitude of the supply voltage is an additional variable. As explained above, the supply voltage applied to microprocessor unit 110 is typically not very well regulated. Therefore, the voltage used to charge capacitor 143 through variable resistor 141 and thermistor 142 can vary depending upon the state of triac 133. This variation in supply voltage causes a variation in the time required to charge capacitor 143 to the predetermined voltage. These variations in the supply voltage can cause inaccuracies in the measured temperature.

As a result of these factors, the designer in accordance with the prior art could make one of two relatively disadvantageous choices. Firstly, a highly complex power supply regulator 120 which provides an excellent regulation of the power supply to microprocessor unit 110 could be employed together with a high precision thermistor 142 and a high precision capacitor 143. A design of this type would serve to eliminate many of the sources of inaccuracy in the measurement of a temperature in accordance with the above described circuit. On the other hand, this provision for a highly accurate power supply regulator 120 and precision components would require additional expense in the construction of the electronic thermostat. On the other hand, a relatively low accuracy power supply regulator 120 could be employed with relatively inexpensive but less precise components. This design technique reduces the cost of electronic thermostat 110 with a consequent decrease in the accuracy of the temperature measurement and thus the accuracy of the control of temperature.

Figure 2:
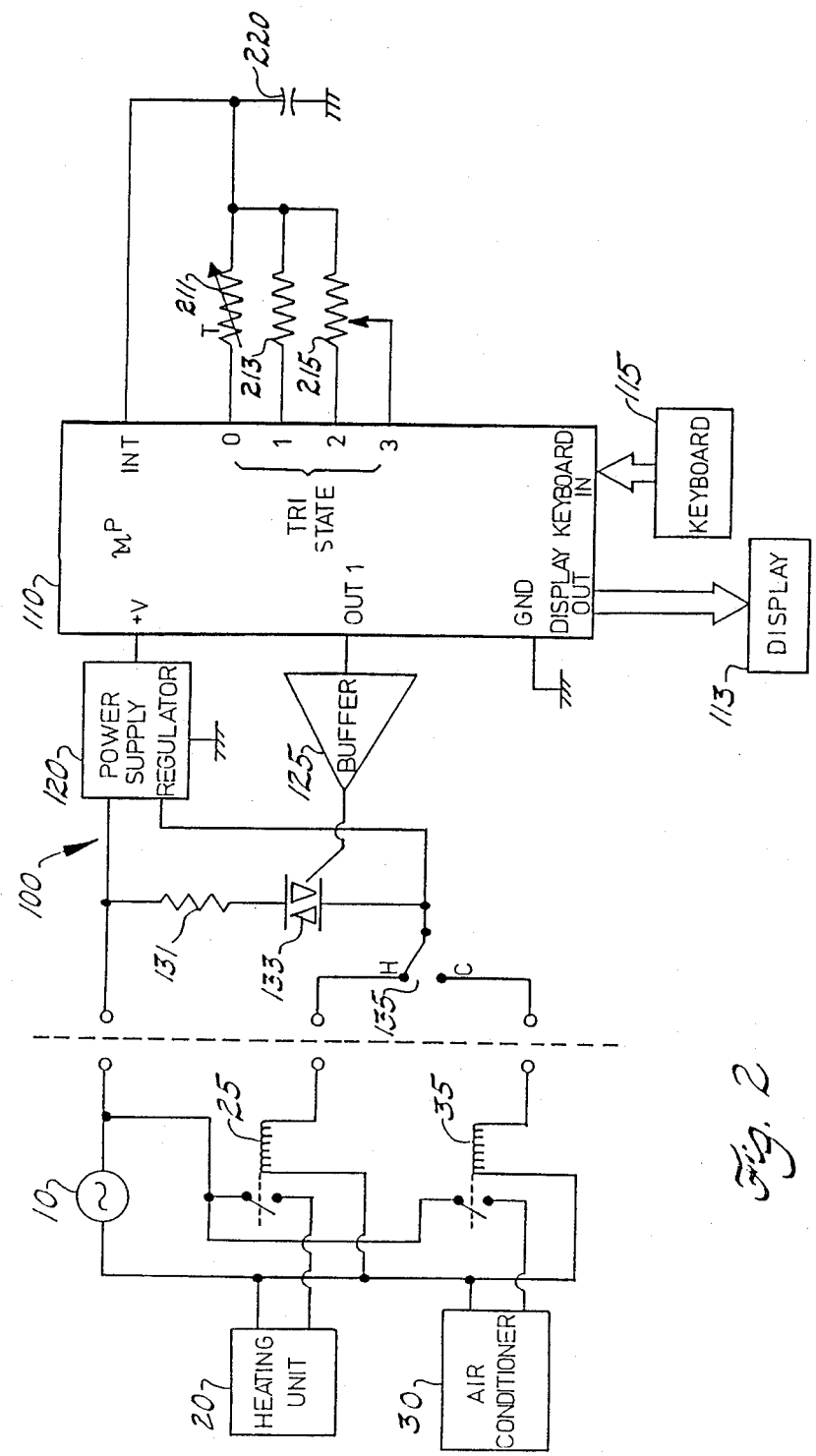
FIG. 2 illustrates connections to the microprocessor for reading the temperature indicated by the triac and a set point set by a potentiometer.

FIG. 2 illustrates a circuit similar to the circuit illustrated in FIG. 1 for measuring the resistance of a thermistor 211. FIG. 2 illustrates a RC time circuit including a plurality of resistances and a single capacitance, capacitor 220. Thermistor 211 is connected between the tristate output line 0 of microprocessor device 110 and capacitor 220. Similarly, a high precision fixed resistor 213 is connected between tristate output line 1 and the capacitor. Further, a potentiometer 215 has its fixed resistance connected between tristate output line 2 and the capacitor and its variable resistance connected between tristate output line 3 and the capacitor. Although a discharge circuit such as transistor 144 is not illustrated in FIG. 2, it would be understood by those skilled in the art that such a discharge circuit could be employed.

The object of the invention illustrated in FIG. 2 is to increase the accuracy of temperature measurement while reducing the need for precision components. Precision fixed resistor 213 is the only precision component required in this circuit. In addition, a power supply regulator 120 having relatively poor regulation can be employed with this circuit. The use of precision fixed resistor 213 as the single precision component reduces the cost of construction because precision fixed resistors are much less expensive than precision thermistors or precision fixed capacitors.

Measurement of the resistance of thermistor 21 occurs in a manner similar to that described above in conjunction with the description of FIG. 1. Capacitor 220 is discharged. This could occur through a discharge device such as transistor 144 illustrated in FIG. 1. Because a discharge transistor such as transistor 144 has a very low impedance very little time would be required to discharge capacitor 220 using such a device. Alternatively this discharge could occur by tying all of the tristate output lines 0–3 to the ground potential by applying a "0" output to these lines. This latter technique is believed advantageous because it reduces the need for components external to the microprocessor unit 110. Because such a discharge path would involve a much higher impedance than a discharge transistor, care must be taken to maintain this discharge condition for a sufficiently long time. This period of time should be at least seven times the time constant of the combined discharge path and capacitor 220. Once the capacitor 220 has been sufficiently discharged, an indeterminate high impedance is applied to tristate output lines 1–3. At the same time, a "1" output is applied to tristate output line 0. At the same time an elapsed timer is started in a manner similar to that described above. When the voltage across capacitor 220 reaches the predetermined threshold voltage of the interrupt input INT of microprocessor unit 110, then the elapsed time on the elapsed time counter corresponds to the resistance of thermistor 211. This in turn corresponds to the temperature at thermistor 211.

After this measurement has been made then a second measurement is made. Firstly, capacitor 220 is discharged in a manner similar to that described above. Then capacitor 220 is charged via precision fixed resistor 213. This is achieved by applying an indeterminate high impedance output to tristate output lines 0, 2 and 3 and by applying a digital "1" output to tristate line 1. This applies the power supply voltage across the RC circuit including precision fixed resistor 213 and capacitor 220. In the same manner as previously described, the elapsed time is measured from the first application of voltage across capacitor 220 until the voltage across capacitor 220 exceeds the predetermined threshold of the interrupt input INT. This elapsed time is a measure of the resistance of precision fixed resistor 213.

In accordance with the preferred embodiment, the resistance selected for the precision fixed resistor 213 is approximately equal to the nominal value of the resistance of thermistor 211 at a selected reference temperature, such as 70° F. The arithmetic computational capability of the microprocessor 110 is then used to compute the ratio of the time constant measured through thermistor 211 and the time constant measured through precision resistor 213. This ratio of times gives an indication of the ratio of the resistance of thermistor 211 to the resistance of precision fixed resistor 213. The computation of this ratio has the advantageous effect of eliminating sources of variability. The value of capacitance 220 is the same for each measurement. In addition, if these time constant measurements take place sequentially, the power supply voltage of microprocessor 110 cannot change greatly during this interval. Thus the formation of this ratio serves to eliminate many of the sources of inaccuracy of the measurement of the resistance of thermistor 211. This serves to permit a more precise measure of the temperature.

FIG. 2 also illustrates connections for determining the operator set position of a potentiometer. This technique employs a ratio in the manner similar to that described above in conjunction with measuring the resistance of thermistor 211. First, capacitor 220 is discharged. Then capacitor 220 is charged through the fixed value of potentiometer 215. This is accomplished by driving the tristate output line 2 to a digital "1" while leaving the other tristate output lines at the indeterminate high impedance state. Thus capacitor 220 is charged through the fixed resistance of potentiometer 215. The time necessary for the voltage across capacitor 220 to reach the predetermined threshold of the interrupt input is measured. Next, capacitor 220 is again discharged. Capacitor 220 is then charged through the variable portion of potentiometer 215. This is accomplished by setting the output of tristate output line 3 to a digital "1", thereby applying the power supply voltage to the variable wiper contact of the potentiometer. At the same time, the other tristate output lines are set to the high impedance state. Thus capacitor 220 is charged only through the variable wiper of potentiometer 215. Again, the amount of time for the voltage across capacitor 220 to reach the predetermined value of the interrupt input is measured. The output or set point of potentiometer 215 is determined by forming the ratio of the charge time through the wiper input to the charge time through the fixed resistance. As in the case of the measurement of the resistance of thermistor 211 described above, the taking of this ratio serves to reduce the measurement error due to variable parameters. In the case of the measurement of the set point of the potentiometer, the same capacitor 220 is employed, thereby eliminating any variability in the nominal value of the capacitor. In addition, if these time and measurements are taken sequentially, any variation in the power supply voltage is minimized because the change in power supply voltage over such a short period is small.

Figure 3A:
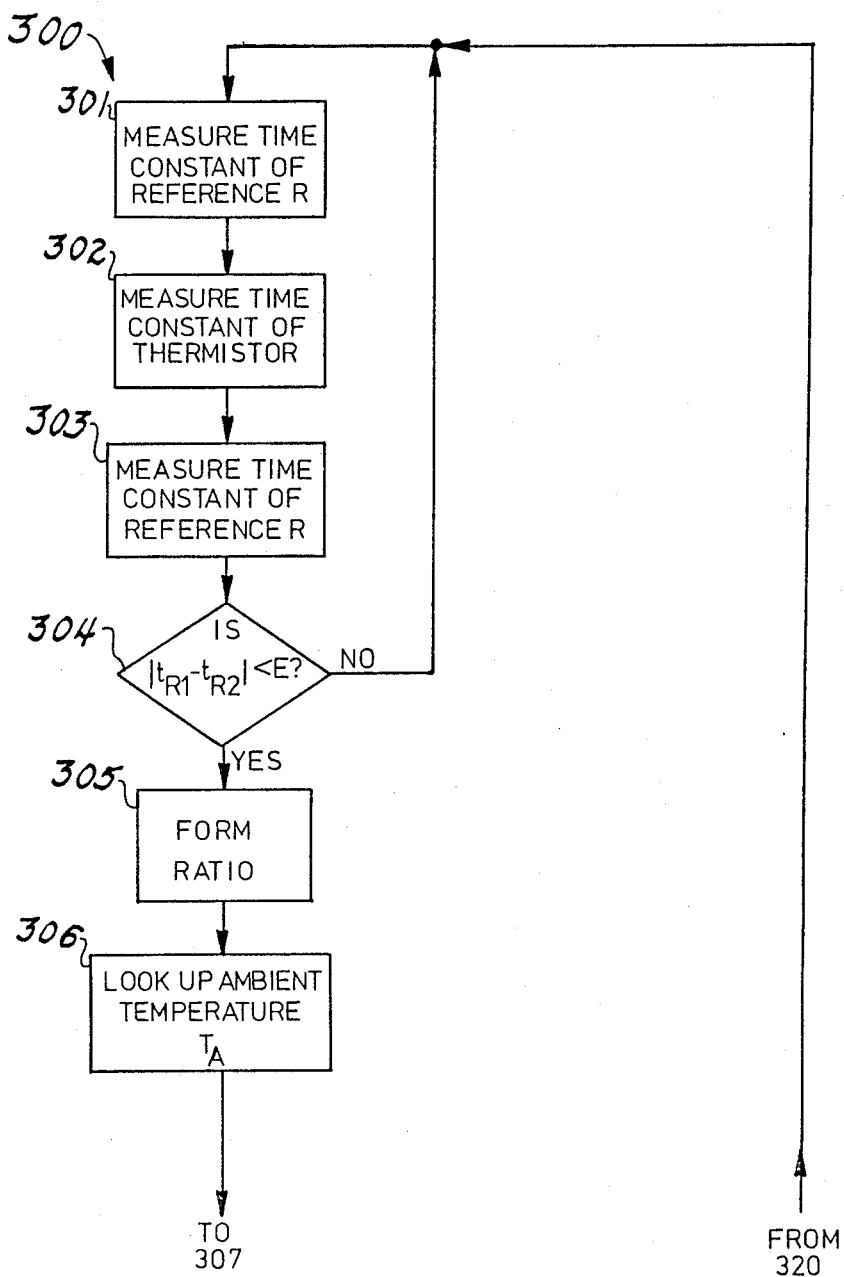
FIGS. 3a and 3b illustrates a program for a simple electronic set point thermistor employing the circuitry illustrated in FIG. 2.
Figure 3B:
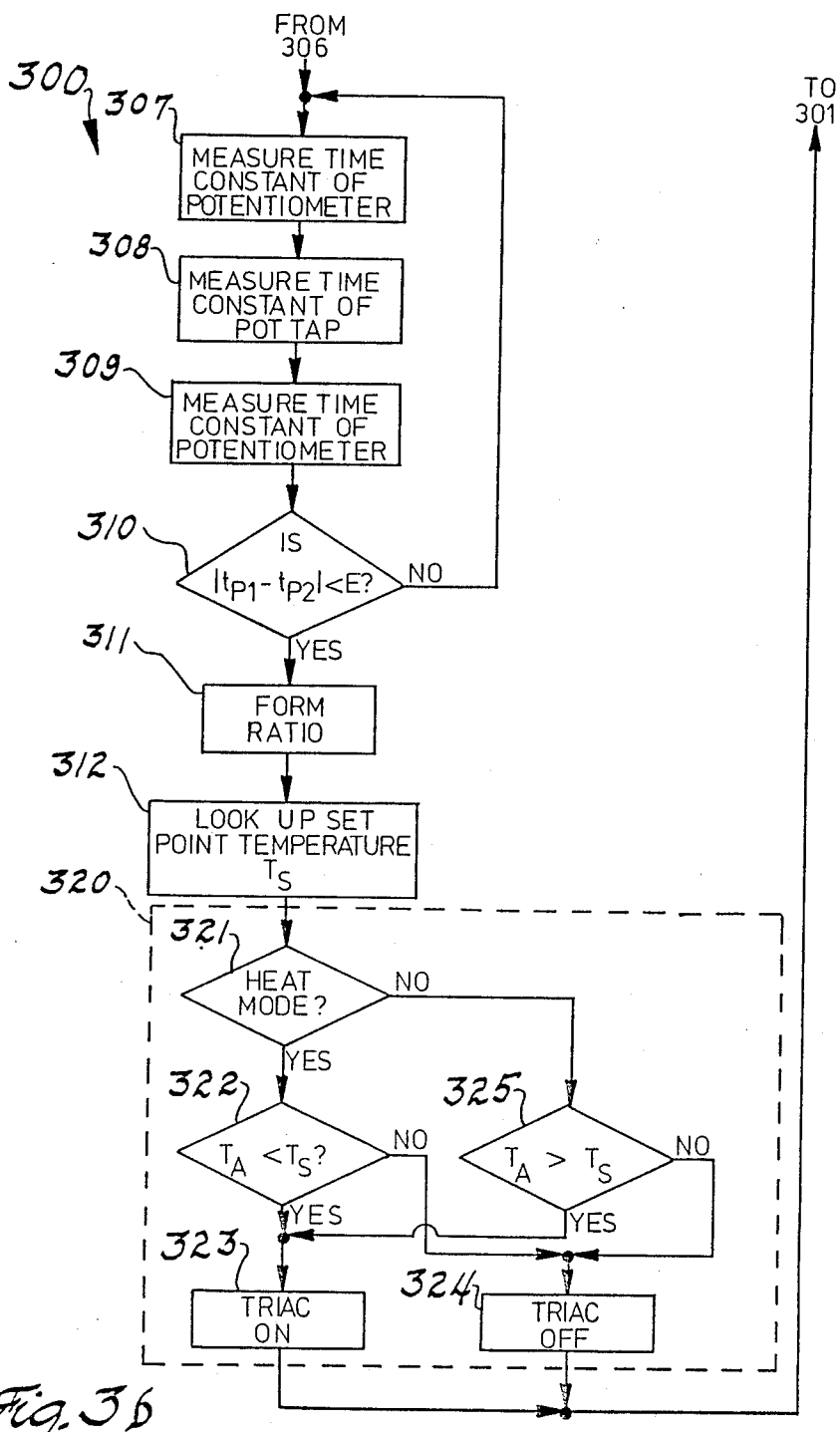

FIGS. 3a and 3b illustrates the flow chart of a program for microprocessor unit 110. This program for microprocessor unit 110 causes electronic thermostat 100 to be a simple manual set point thermostat. The manual set point is set by the position of potentiometer 215.

FIGS. 3a and 3b illustrates program 300 in flow chart form. Program 300 is a continuous loop which is continuously executed in order to provide thermostatic control of the selected heating unit or air conditioner. The discussion of program 300 will begin with processing block 301 (FIG. 3a). Processing block 301 measures the time constant of the RC circuit including precision fixed resistor 213 and capacitor 220. The manner of performing this time measurement has been explained above, and will be further explained in regard to subroutine 400. Program 300 next measures the time constant of the RC circuit including thermistor 211 (processing block 302). This time measurement takes place in a similar fashion. Next, program 300 again measures the time constant of the RC circuit including precision fixed resistor 213 (processing block 303). This second measurement through precision fix register 213 is employed to further minimize any effect due to the changing power supply voltage.

Program 300 tests to determine whether the two time constant measurements of the precision fixed resistor 213 are within a predetermined error limit E (decision block 304). This is determined by taking the absolute value of the difference between the first time constant value $t_{R1}$ and the second time constant value $t_{R2}$. These two measurements are within the error limit E if this absolute value is less than E. If the two measurements are not within this error limit E then program control passes to processing block 301 to measure the time constant of the precision fixed resistor 213 again. Program 300 remains within this loop until the two time constant measurements are within the predetermined error limit E. This process assures that the measurement conditions have not appreciably changed during the period when the three time constant measurements are taken.

Once the measurements regarding the thermistor time constant have been completed, Program 300 forms the ratio of the thermistor time constant to the precision fixed resistor time constant (processing block 305) by the formula:

$$t_{TC} = t_T / t_{R1}$$

where $t_{TC}$ is the corrected time constant of the thermistor, $t_T$ is the uncorrected time constant of the thermistor, and $t_{R1}$ is the first measured time constant of the reference resistor. This ratio is next employed with a look-up table in order to derive the measured ambient temperature $T_A$ (processing block 306).

Program 300 next measures the set point of potentiometer 215 (FIG. 3b). This is accomplished by measuring the time constant of the constant portion of potentiometer 215 (processing block 307). This is followed by the measurement of th e time constant th rough the potentiometer tap (processing block 308). Lastly, a second measurement of the time constant through the entire fixed portion of the potentiometer is made (processing block 309).

Program 300 then makes a test similar to that indicated above in relation to the measurement of the time constant of the thermistor. Program 300 tests to determine if the absolute value of the difference between the first measured time constant of the potentiometer $t_{P1}$ and the second measured time constant of the potentiometer $t_{P2}$ is less than a predetermined error limit E (decision block 310). If it is not, then the measurement process is repeated. As previously described Program 300 remains in this loop until the measurement is complete.

A ratio is then formed in the microprocessor of the time constant measured (processing block 311). This ratio is similar to the ratio previously described for determination of the temperature measured by the thermistor. This ratio is calculated as follows:

$$t_S = t_{TP} / t_{P1}$$

where $t_S$ is the corrected set point measured by the potentiometer tap, $t_{TP}$ is the uncorrected time constant through the potentiometer tap, and $t_{P1}$ is the first measurement of the time constant through the fixed portion of the potentiometer. Program 300 then resorts to a look-up table to convert this ratio to the set point temperature $T_S$ (decision block 312).

Program 300 then performs the thermostatic control. This is shown embodied by an illustrative subroutine 320. Subroutine 320 is a simple example of thermostatic control employing the sensing circuits of the present invention. Those skilled in the art would recognize that the sensing circuits of the present invention could be employed with other thermostatic control processes.

Subroutine 320 of program 300 determines whether or not the electronic thermostat 100 is in heating mode (decision block 321). This heating mode is set via keyboard 115 in conjunction with the position of heat/cool mode switch 135 to determine the particular algorithm employed. If the electronic thermostat 100 is in heat mode then program 300 tests to determine whether or not the ambient temperature is less than the set point temperature (decision block 322). If this is the case then the triac 133 is triggered on (processing block 323) in order to activate heating unit 20 and raise the temperature. On the other hand, if the ambient temperature is not less than the set point then triac 133 is not triggered ON (processing block 324). In this event it is not necessary to operate heating unit 20 to raise the temperature above the set point temperature.

If the electronic thermostat 100 is not in the heating mode then program 300 tests to determine whether or not the ambient temperature is greater than the set point temperature (decision block 325). In the event that the ambient temperature is greater than the set point temperature then triac 133 is triggered ON (decision block 323). In conjunction with the position of heat/cool mode switch 135, this serves to turn on air conditioner 300 to lower the temperature. If the ambient temperature is not greater than the set point temperature then program 300 does not trigger triac 133 ON (processing block 324). Thus air conditioner 30 is not actuated because it is not needed.

Figure 4:
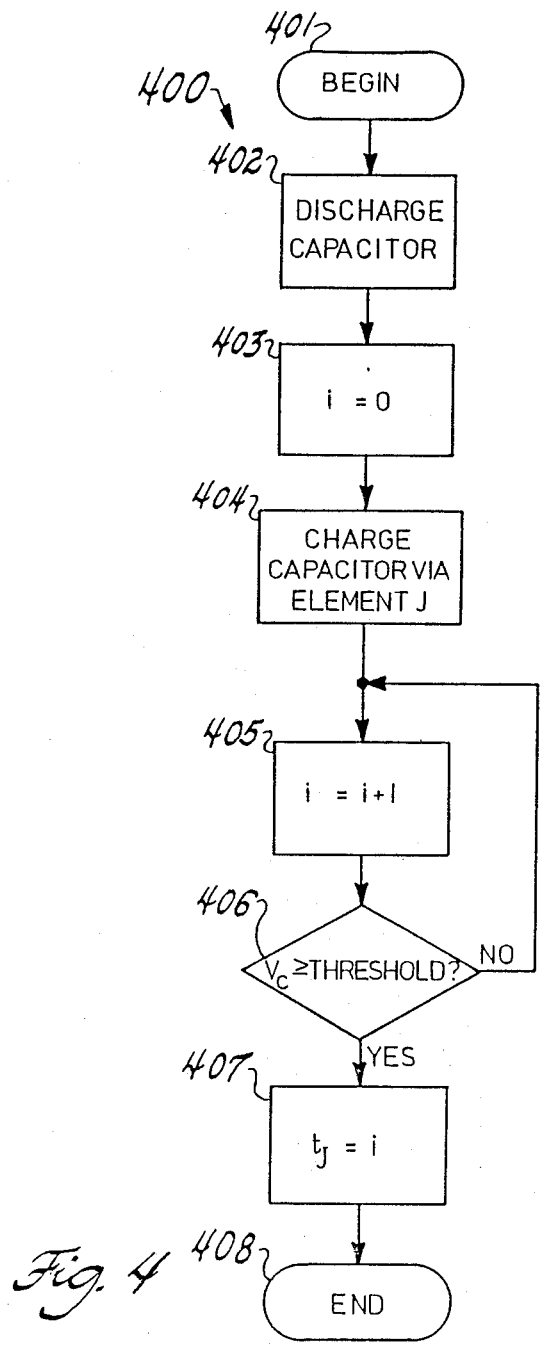
FIG. 4 illustrates an example of the subroutine for measuring the time constant of an RC circuit connected in the manner illustrated in FIG. 2.

Program 400 illustrated in FIG. 4 is a flow chart of the manner in which the time constants are measured in program 300. Subroutine 400 is employed to embody processing blocks 301, 302, 303, 307, 308 and 309 illustrated in FIGS. 3a and 3b. Subroutine 400 is begun at start block 401. Subroutine 400 first discharges capacitor 220 processing block 402). This could take place with the use of an external device such as transistor 144 illustrated in FIG. 1 or via the tristate output lines 0-3. Next, an index variable i is initialized (processing block 403). The capacitor 220 is then charged via the particular element J (processing block 404) by actuation of the proper tristate output lines 0-3. Subroutine 400 then increments the index variable i (processing block 405). Next, subroutine 400 tests to determine whether or not the voltage across capacitor 220 $V_C$ is greater than or equal to the threshold voltage (decision block 406). If this is not the case then the measurement is not complete and subroutine 400 returns to processing block 405. If this is the case then the measurement is complete.

The measured time for the element J $t_J$ is set equal to the index variable i (processing block 407). Subroutine 400 is then complete and is exited via end block 408.

In a practical embodiment of subroutine 400, the incrementing step 405 would be performed by adding 1 to a memory register within microprocessor unit 110. The processing of determining whether or not the voltage across the capacitor $V_C$ exceeds the predetermined threshold of decision block 406 can be employed via the interrupt input of INT microprocessor device 110. Thus for example the incrementing of the index variable i can occur within a closed loop and this loop be broken only at the receipt of the interrupt. The interrupt is detected when the voltage across the capacitor exceeds the predetermined threshold of the interrupt input INT. Because this interrupt input INT typically includes a Schmidt trigger device, there is very little time between the time at which the voltage crosses the threshold voltage and the generation of the interrupt. This interrupt signal stops the incrementing of the index variable i and causes this value to be stored as the measured time. Thus the clock which controls the rate of operation of the microprocessor device 110 serves as a timer to time the number of increments of the index variable i.

We claim:

1. An analog to digital conversion apparatus comprising:

an analog sensing device having a variable resistance dependent upon an environmental condition, having a first terminal and a second terminal;

a precision fixed resistor having a resistance value near the nominal value of resistance of said analog sensing device, having a first terminal and a second terminal;

a capacitor having a first terminal connected to said second terminal of said analog sensing device and said second terminal of said precision fixed resistor and a second terminal connected to a reference voltage;

a discharge means connected to said capacitor for discharging said capacitor;

a first time constant measuring means connected to said analog sensing means, said capacitor and said discharge means for measuring the variable time constant of said analog sensing device by discharging said capacitor via said discharge means, charging said capacitor through said first terminal of said analog sensing device and counting the number of predetermined time intervals required for the voltage across said capacitor to reach a predetermined threshold voltage;

a second time constant measuring means connected to said precision fixed resistor, said capacitor and said discharge means for measuring the reference time constant of said precision fixed resistor and said capacitor by discharging said capacitor via said discharge means, charging said capacitor through said first terminal of said precision fixed resistor and counting the number of predetermined time intervals required for the voltage across said capacitor to reach said predetermined threshold voltage;

a measurement sequence means connected to said first time constant measurement means and said second time constant measurement means for producing a sequence of measurements by causing said second time constant measurement means to measure said reference time constant a first time thereby producing a first count, then causing said first time constant measurement means to measure said variable time constant, then causing said second time constant measurement means to measure said reference time constant a second time thereby producing a second count, and for comparing said first count and said second count and repeating said sequence of measurements if said first count and said second count differ by more than a predetermined amount; and a ratio means connected to said first time constant measurement means, said second time constant measurement means and said measurement sequence means for computing the digital ratio of the count of predetermined time intervals of said variable time constant and the count of predetermined tim intervals of said reference time constant if said first count and said second count do not differ by more than a predetermined amount, said ratio being the digital representation of the environmental condition sensed by said analog sensing device.

2. An analog to digital conversion apparatus for use with a microprocessor device having at least two tristate output lines and an interrupt input comprising:

a analog sensing device having a variable reference resistance dependent upon an environmental condition, having a first terminal connected to a first of said tristate output lines and a second terminal connected to said interrupt input;

a precision fixed resistor having a resistance value near the nominal resistance value of said analog sensing device, having a first terminal connected to a second of said tristate output lines and a second terminal connected to said interrupt input;

a capacitor having a first terminal connected to said interrupt input, and a second terminal connected to a reference voltage;

a discharge means connected to said capacitor and controlled by said microprocessor device for discharging said capacitor; and the microprocessor device being programmed for measuring the reference time constant of said precision fixed resistor and said capacitor by discharging said capacitor via said discharge means, charging said capacitor through said first terminal of said precision fixed resistor by applying a digital "1" output to said second tristate output line and applying a high impedance output to the other of said at least two tristate output lines and counting the number of predetermined time intervals required for the voltage across said capacitor to reach a predetermined threshold voltage at said interrupt input, thereby producing a first count, measuring the variable time constant of said analog sensing device and said capacitor by discharging said capacitor via said discharge means, charging said capacitor through said first terminal of said analog sensing device by applying a digital "1" output to said first tristate output line and applying a high impedance output to the other of said at least two tristate output lines and counting the number of predetermined time intervals required for the voltage across said capacitor to reach a predetermined threshold voltage at said interrupt input, measuring the reference time constant of said precision fixed resistor and said capacitor a second time by discharging said capacitor via said discharge means, charging said capacitor through said first terminal of said precision fixed resistor by applying a digital "1" output to said second tristate output line and applying a high impedance output to the other of said at least two tristate output lines and counting the number of predetermined time intervals required for the voltage across said capacitor to reach said predetermined threshold voltage at said interrupted input, thereby producing a second count, comparing said first count and said second count, if said first count and said second count differ by more than a predetermined amount, again measuring the reference time constant of said precision fixed resistor and said capacitor thereby producing another first count, again measuring the variable time constant of said analog sensing device and said capacitor, again measuring the reference time constant of said precision fixed resistor and said capacitor thereby producing another second count, and again comparing said first count and said second count, and if said first count and said second count do not differ by more than said predetermined amount computing the digital ratio of said count of predetermined time intervals of said variable time constant and said count of predetermined time intervals of said reference time constant, said digital ratio being the digital representation of the environmental condition sensed by said analog sensing device.

3. The analog to digital conversion apparatus claimed in claim 2, wherein:

said microprocessor device is further programmed for counting the number of predetermined time intervals required for the voltage across said capacitor to reach a predetermined threshold voltage at said interrupt input by incrementing a memory register at the rate of operation of said microprocessor under closed loop program operation until an interrupt input is received.

4. The analog to digital conversion apparatus claimed in claim 2, wherein:

said microprocessor device is further programmed for discharging said capacitor by applying a digital "O" output at least one of said tristate output lines for a predetermined period of time, whereby said discharge means consists of said analog sensing device, said precision fixed resistor and said at least two tristate output lines of said microprocessor device.

5. A method of forming a digital signal representing an environmental condition comprising the steps of:

measuring the reference time constant of a precision fixed resistor and a capacitor, by discharging said capacitor, charging said capacitor through said precision fixed resistor and counting the number of predetermined time intervals for the voltage across said capacitor to reach a predetermined threshold voltage, thereby producing a first count;

measuring the variable time constant of an analog sensing device having a variable resistance dependent upon the environmental condition and said capacitor, by discharging said capacitor, charging said capacitor through said analog sensing device and counting the number of predetermined time intervals for the voltage across said capacitor to reach said predetermined threshold voltage;

again measuring the reference time constant of a precision fixed resistor and said capacitor, by discharging said capacitor, charging said capacitor through said precision fixed resistor and counting the number of predetermined time intervals for the voltage across said capacitor to reach said predetermined threshold voltage thereby producing a second count;

comparing said first count and said second count, if said first count differs from said second count by more than a predetermined amount then again measuring the reference time constant of said precision fixed resistor and said capacitor, thereby producing a new first count, again measuring the variable time constant of said analog sensing device and said capacitor, and again measuring the reference time constant of said precision fixed resistor and said capacitor, thereby producing a new second count, and then again comparing said first count and said second count, and if said first count does not differ from said second count by more than said predetermined amount, computing the digital rates of said count of the number of predetermined tim intervals of said variable time constant and said count of the number of predetermined time intervals of said reference time constant, said digital ratio being the digital representation of the environmental condition sensed by said analog sensing device.

* * * * *